United States Patent
Takano et al.

(12)

(10) Patent No.: US 9,362,250 B2
(45) Date of Patent: Jun. 7, 2016

(54) DIE BONDER AND BONDING METHOD

(71) Applicant: Fasford Technology Co., Ltd., Minami-Alps, Yamanashi (JP)

(72) Inventors: Ryuichi Takano, Kumagaya (JP); Naoki Okamoto, Kumagaya (JP)

(73) Assignee: Fasford Technology Co., Ltd., Minami-Alps (JP)

( * ) Notice: Subject to any disclaimer, the term of this patent is extended or adjusted under 35 U.S.C. 154(b) by 312 days.

(21) Appl. No.: 13/784,253

(22) Filed: Mar. 4, 2013

(65) Prior Publication Data
US 2014/0069564 A1 Mar. 13, 2014

(30) Foreign Application Priority Data
Sep. 13, 2012 (JP) ................................ 2012-201728

(51) Int. Cl.
*B29C 65/00* (2006.01)
*H01L 23/00* (2006.01)

(52) U.S. Cl.
CPC ............... *H01L 24/74* (2013.01); *H01L 24/75* (2013.01); *H01L 2224/75317* (2013.01); *Y10T 156/10* (2015.01)

(58) Field of Classification Search
CPC ............. H01L 21/67144; H01L 22/26; H01L 21/6838; H01L 24/74; B29C 65/00; B29C 66/8161; B29X 66/8163
USPC ............................. 156/60, 64, 378, 379, 580
See application file for complete search history.

(56) References Cited

U.S. PATENT DOCUMENTS

| 5,402,300 | A | * | 3/1995 | Ikoma | H01F 7/066 335/177 |
|---|---|---|---|---|---|
| 2009/0064830 | A1 | * | 3/2009 | Geiser | 82/124 |
| 2012/0279660 | A1 | * | 11/2012 | Chan et al. | 156/378 |

FOREIGN PATENT DOCUMENTS

| JP | 4-321243 A | 11/1992 |
|---|---|---|
| JP | 7-15916 B2 | 2/1995 |
| JP | 2001-156083 A | 6/2001 |

OTHER PUBLICATIONS

Korean Office Action dated Jan. 6, 2014 (four (4) pages).

* cited by examiner

*Primary Examiner* — Michael N Orlando
*Assistant Examiner* — Joshel Rivera
(74) *Attorney, Agent, or Firm* — Crowell & Moring LLP

(57) ABSTRACT

The present invention provides a bonding device and a bonding method with a high operation ratio by solving the problems of conventional techniques.
In the present invention, a collet holder grasping a used collet is inserted from a first opening portion with the upper face open; the used collet is engaged with first engagement portions provided at the first opening portion of a discarding unit; the used collet is removed from the collet holder to be discarded by lifting the collet holder; the collet holder is inserted from a second opening portion with the upper face open of a supplying unit; the uppermost unused collet among plural stacked unused collets is grasped; and the uppermost unused collet ejected from the first opening portion is attached to the collet holder.

9 Claims, 7 Drawing Sheets

DIE BONDER AND BONDING METHOD

BACKGROUND OF THE INVENTION

1. Field of the Invention

The present invention relates to a die bonder and a bonding method, and particularly to a die bonder and a bonding method with a high operation ratio.

2. Description of the Related Art

As a part of steps of mounting a die (semiconductor chip) (hereinafter, simply referred to as a die) on a substrate such as a printed circuit board or a lead frame to assemble a package, a step of dividing a semiconductor wafer (hereinafter, simply referred to as a wafer) into dies and a bonding step of mounting the divided dies on the substrate are provided.

In the bonding step, the dies divided from the wafer are peeled off one-by-one from a dicing tape to be bonded on the substrate using an absorption jig that is referred to as a collet.

In such a die bonder, it is necessary to replace the collet in accordance with the type (die size), or to increase the frequency of replacement of the collet in contact with the surface of the die to prevent damage or taint of the surface of the die.

As conventional techniques of replacing the collet, for example, there are those described in Japanese Patent Application Laid-Open No. H4-321243 and Japanese Patent Application Laid-Open No. 2001-156083 are known. In Japanese Patent Application Laid-Open No. H4-321243, a collet clamper that holds a collet and a spring that operates the collet clamper are provided at the tip end of a bonding head to mechanically control the operation. Thus, the collet is replaced using a collet holder (a stock unit for collets for replacement, and corresponding to a supplying unit and a discarding unit of the application). On the other hand, in Japanese Patent Application Laid-Open No. 2001-156083, a collet attached to the tip end of a collet shank is inserted from the side to a port in a U-groove shape, and the collet is removed from the collet shank. Then, the collet shank is inserted into plural collets for replacement disposed on a plane, and is attached thereto. Further, Japanese Patent Application Laid-Open No. 2001-156083 discloses that the attachment of the collet is confirmed on the basis of the descent distance of the collet shank or optical means.

However, in the technique disclosed in Japanese Patent Application Laid-Open No. H4-321243, the mechanism of the tip end of the collet clamper is disadvantageously complicated. On the other hand, in the technique disclosed in Japanese Patent Application Laid-Open No. 2001-156083, an inserting space and a replacement area for collets for replacement become disadvantageously wide. Further, a die package has recently become thinner and the following problems occur. First, since a collet holder to hold a collet that stably absorbs the thinner die is used, it is necessary to replace only the collet while leaving the collet holder. Second, when confirming the attachment of the collet, it is necessary to move the collet to another installation position such as an alignment stage in a method using the descent distance of the collet shank, and the attachment cannot be promptly confirmed at the time of replacement. In addition, new optical means needs to be provided, or it is necessary to move to an area where another optical means is provided. Third, variations in the height of the collet at the time of manufacturing in a unit of nm have an impact on the descent distance of the collet when mounting the die, and it is necessary to address this problem.

Accordingly, an object of the present invention is to provide a bonding device and a bonding method with a high operation ratio by solving at least one of the above-described problems.

SUMMARY OF THE INVENTION

In order to achieve the above-describe object, the present invention includes at least the following characteristics.

The present invention provides a die bonder including: a collet holder that holds a collet; a bonding head that includes the collet holder at its tip end and absorbs a die with the collet to bond the die on a substrate; a collet replacing unit having a discarding unit that includes a first opening portion having plural first engagement portions engaged with the collet on the upper side and discards a used collet, a supplying unit that includes a second opening portion on the upper side, stacking plural unused collets, and a moving means that moves the unused collets to the second opening portion, and a protrusion prevention means to prevent the unused collets from protruding from the second opening portion; and a control device that inserts the collet holder from the first opening portion, controls the engagement of the engagement portions with the collet holder to discard the used collets to the discarding unit, inserts the collet holder from the second opening portion, and ejects the plural stacked unused collets to be attached to the collet holder.

Further, the present invention provides a bonding method including the steps of: bonding a die to a substrate after absorbing the die with a collet of a bonding head having a collet holder holding the collet at its tip end; inserting the collet holder grasping a used collet from a first opening portion with the upper face open; engaging the used collet with first engagement portions provided at the first opening portion; discarding the used collet after removing the same from the collet holder by lifting the collet holder; inserting the collet holder from a second opening portion with the upper face open; grasping the uppermost unused collet among plural stacked unused collets; and attaching the uppermost unused collet ejected from the first opening portion to the collet holder.

Further, in the present invention, the engagement portions are provided so as to be engaged with a part of the collet, and the part of the collet may include avoiding portions to avoid the engagement portions.

Further, in the present invention, the second opening portion includes second engagement portions having the same structures as those of the first engagement portions, the protrusion prevention means is each of the second engagement portions, and the engagement of the second engagement portions with the collet holder may be controlled to attach the unused collets to the collet holder.

Further, the first engagement portions or the second engagement portions are fixing claws or movable claws that are provided at the first opening portion and the second opening portion, respectively, so as to be engaged with the collets, and the engagement with the fixing claws or the movable claws may be controlled while rotating the collets in parallel with the first opening portion and the second opening portion.

Further, in the present invention, the attachment of the collet may be confirmed.

Further, in the present invention, the attachment of the collet may be confirmed on the basis of changes in the volume of flow flowing to an absorption hole of the bonding head including the collet holder or differential pressure.

Further, in the present invention, the height of the collet held by the collet holder is measured, and the descent distance of the collet may be corrected on the basis of the measurement result.

According to the present invention, it is possible to provide a bonding device and a bonding method with a high operation ratio by solving the problems of the conventional techniques.

DETAILED DESCRIPTION OF THE INVENTION

Hereinafter, embodiments of the present invention will be described on the basis of the drawings.

Figure 1:
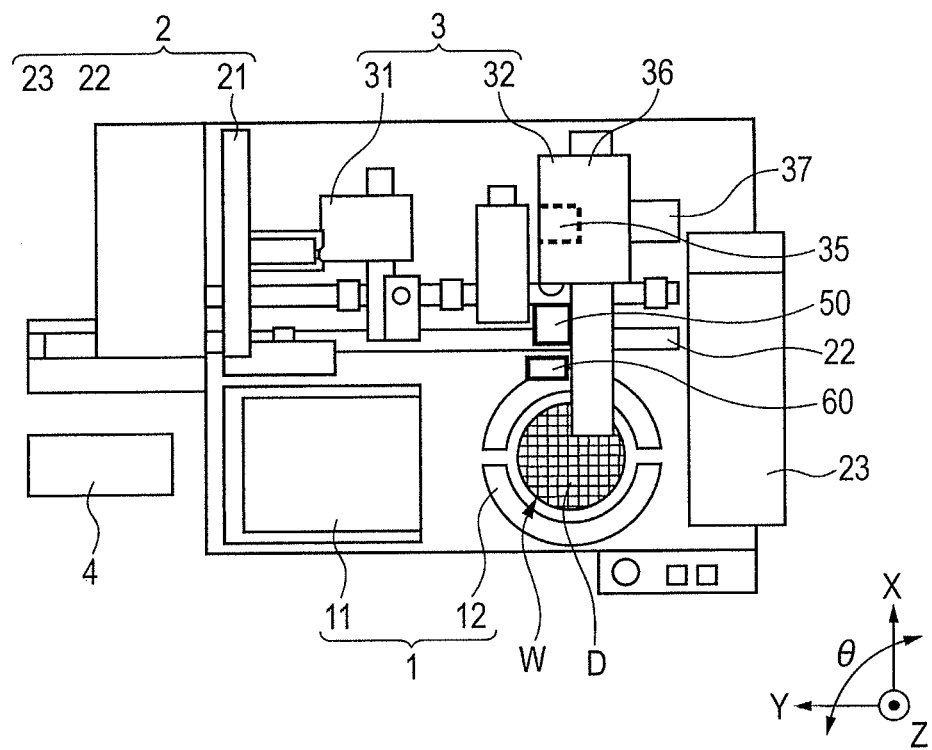
FIG. 1 is a conceptual diagram of a die bonder viewed from the upper side according an embodiment of the present invention.

FIG. 1 is a conceptual diagram of a die bonder 10 viewed from the upper side according to an embodiment of the present invention. The die bonder roughly includes a wafer supplying unit 1, a work supplying/feeding unit 2, a die bonding unit 3, and a control device 4 that controls the respective units and a bonding flow in each embodiment to be described later.

The work supplying/feeding unit 2 includes a stack loader 21, a frame feeder 22, and an unloader 23. A work (a substrate such as a lead frame or a die already laminated on a substrate) supplied to the frame feeder 22 by the stack loader 21 is fed to the unloader 23 via two processing positions on the frame feeder 22.

The wafer supplying unit 1 includes a wafer cassette lifter 11 and a pickup device 12. The wafer cassette lifter 11 includes wafer cassettes (not shown) filled with wafer rings, and sequentially supplies the wafer rings to the pickup device 12. Each wafer ring holds a wafer W having a die D, and the pickup device 12 holds the wafer rings.

The die bonding unit 3 includes a preform unit 31 and a bonding head unit 32. The preform unit 31 applies a die adhesive agent on the work fed by the frame feeder 22.

The bonding head unit 32 includes a bonding head 35, an XZθ driving unit 36 that drives the bonding head in the X or Z direction or rotates the same by $\theta$, a Y driving unit 37 that drives the XZe driving unit in the Y direction, a collet replacing unit 50, and a collet descent distance correcting unit 60. The bonding head 35 is lifted by the XZθ driving unit 36 while picking up the die D from the pickup device 12, and translates the die D in the X direction to a bonding point on the frame feeder 22. Then, the bonding head 35 allows the die D to descend to be bonded onto the work with the die adhesive agent applied.

Hereinafter, as a feature of the embodiments, the collet attachment confirmation means 70 that confirms whether or not a collet is attached, the collet replacing unit 50, and the collet descent distance correcting unit 60 that corrects a collet descent distance after collet replacement will be described.

First Embodiment

Figure 2:
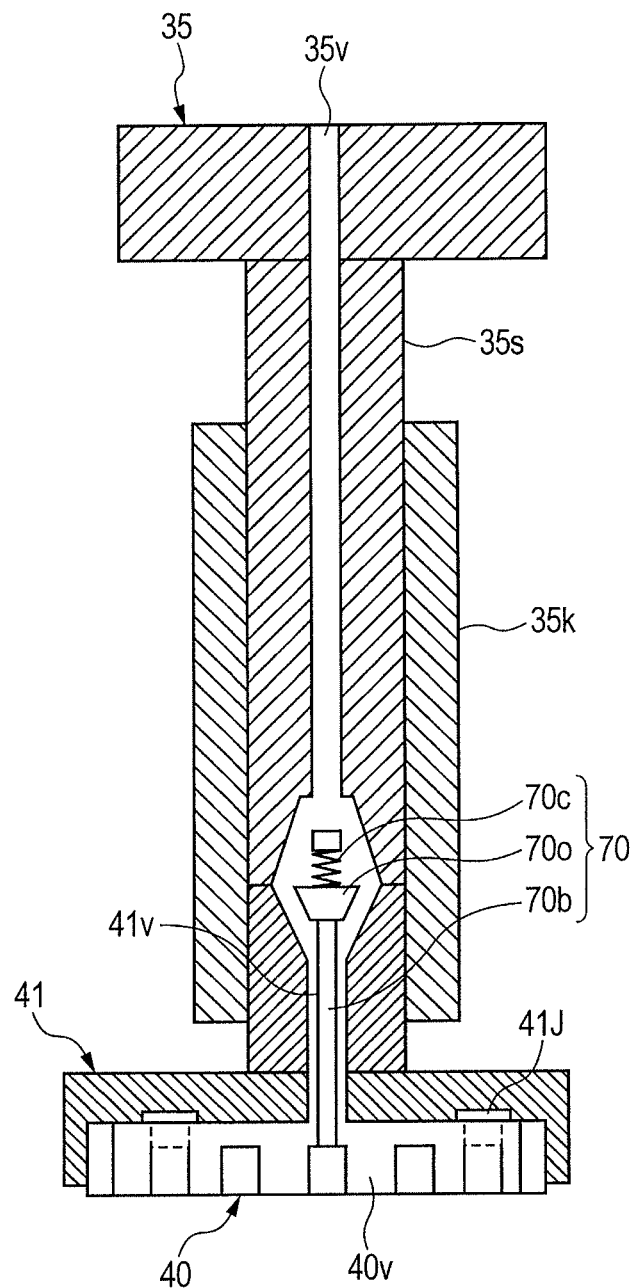
FIG. 2 is a diagram for showing structures of a bonding head, a collet, and a collet holder, and a configuration of collet attachment confirmation means.

In the first place, structures of the bonding head 35, a collet 40 and a collet holder 41 and a configuration of the collet attachment confirmation means 70 will be described using FIG. 2.

The bonding head 35 has, in the middle, an absorption hole $35v$ to which absorption air flows, and includes, on the tip end side, a collet shank $35s$ connected to the collet holder 41 and a collet fixing unit $35k$ that fixes the collet holder 41 to the collet shank $35s$.

The collet holder 41 has, in the middle, an absorption hole $41v$ in communication with the absorption hole $35v$, a magnet $41j$ fixing the collet 40, and the collet attachment confirmation means 70 provided in the absorption hole $41v$.

Figure 4:
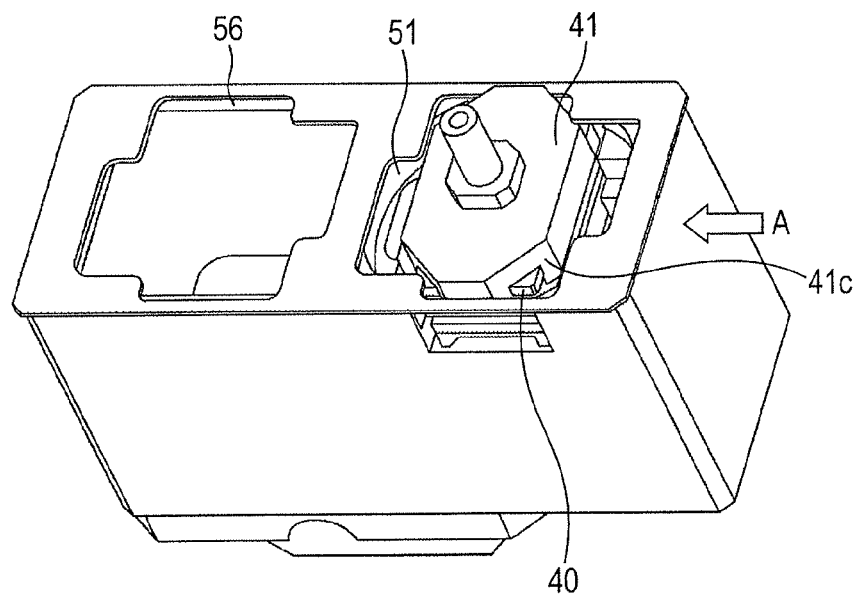
FIG. 4 is a birds-eye view of the collet replacing unit shown in FIG. 1, and is a diagram for showing a state in which the collet holder is grasped to attach the collet.

As shown in FIG. 4, the four sides of the collet 40 are held by the collet holder 41, and the collet 40 includes plural absorption holes $40v$ in communication with the absorption hole $41v$ to absorb the die D.

The collet attachment confirmation means 70 includes an orifice $70o$, a confirmation bar $70b$ with one end fixed to the orifice, and a compression spring $70c$ that presses the orifice towards the collet holder 41. In the case where the collet 40 is attached to the collet holder 41 as shown in FIG. 2, the confirmation bar $70b$ is pushed up by the collet 40 against the compression spring $70c$ in the collet attachment confirmation means 70, and the orifice $70o$ is lifted to secure the volume of air flow. On the other hand, in the case where no collet 40 is attached, the compression spring $70c$ allows the orifice $70o$ to descend to decrease the volume of air flow. The attachment of the collet 40 is confirmed by the volume of air flow or differential pressure.

According to the above-described collet attachment confirmation means 70, the attachment of the collet can be reliably confirmed without providing optical means.

Second Embodiment

Figure 3:
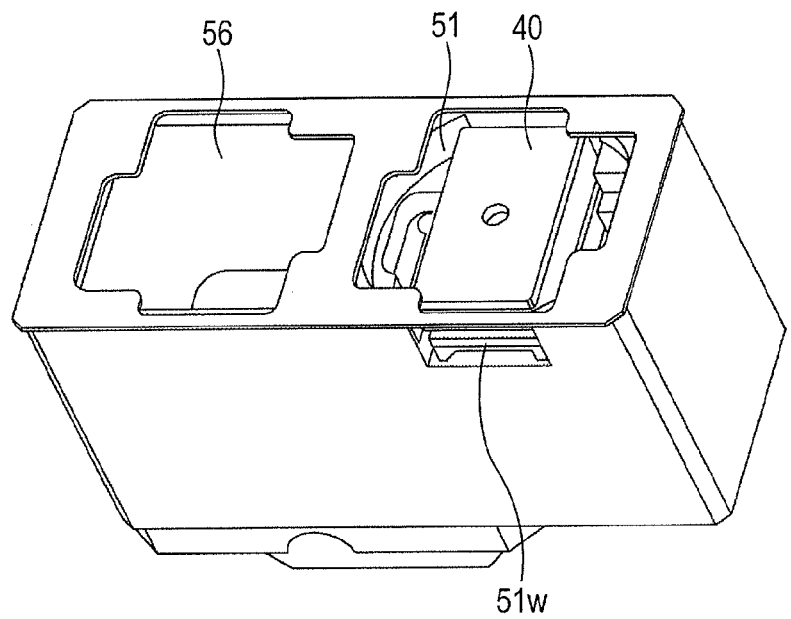
FIG. 3 is a birds-eye view of a collet replacing unit shown in FIG. 1, and is a diagram for showing a state in which an unused collet is housed in a supplying unit.
Figure 5:
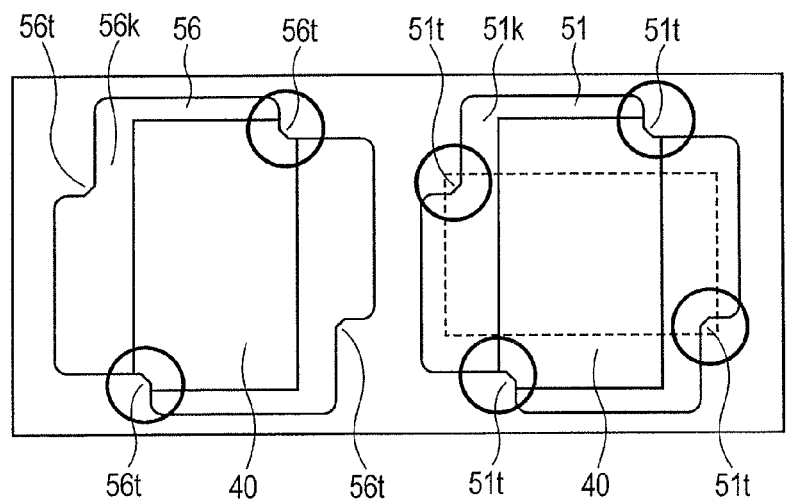
FIG. 5 is a plan view of the collet replacing unit viewed from the upper side in the state of FIG. 3.
Figure 6:
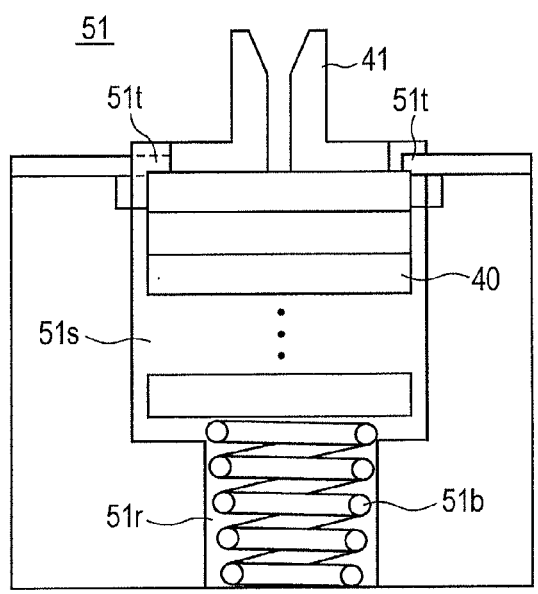
FIG. 6 is a diagram of the inside of the supplying unit viewed from the direction of the arrow A in FIG. 4.

Next, a first example of the collet replacing unit 50 as a second embodiment will be described using the drawings. In the first place, a configuration of the collet replacing unit 50 will be described using FIG. 3 to FIG. 6. Each of FIG. 3 and FIG. 4 is a birds-eye view of the collet replacing unit 50 shown in FIG. 1. FIG. 3 shows a state in which an unused collet 40 is housed in a supplying unit 51. FIG. 4 shows a state in which the collet holder 41 is grasped to attach the collet 40. FIG. 5 is a plan view of the collet replacing unit 50 viewed from the upper side in the state of FIG. 3. FIG. 6 is a diagram of the inside of the supplying unit 51 viewed from the direction of the arrow A in FIG. 4.

As shown in each of FIG. 3 and FIG. 5, the collet replacing unit 50 includes the supplying unit 51 that supplies an unused collet 40, and a discarding unit 56 that discards a used collet 40. The supplying unit 51 and the discarding unit 56 include opening portions 51*k* and 56*k* on the upper side, respectively. The opening portions 51*k* and 56*k* have the same structure, and include fixing claws 51*t* and 56*t*, respectively, of engagement portions at diagonal positions denoted by the circles. It should be noted that in consideration of a case in which the direction of mounting the die D is shifted by 90° as shown by the dotted line in the embodiment, two engagement portions are each provided at the positions where the fixing claws 51*t* and 56*t* are rotated by 90°.

As shown in FIG. 6, the supplying unit 51 includes a collet housing unit 51*s* in which plural unused collets 40 are stacked, a compression spring 51*b* as pressing and moving means that presses and moves the unused collets 40 in the collet housing unit towards the opening portion 51*k*, and a spring housing unit 51*r* in which the compression spring is housed. On the other hand, the discarding unit 56 includes a waste housing unit under the opening portion in which used collets 40 are housed. A cylinder or the like may be provided as the pressing and moving means.

In the supplying unit 51, the fixing claws 51*t* serve as protrusion prevention means to prevent the collet from protruding by being engaged with the collet 40. In addition, the fixing claws 51*t* and 56*t* are highly important when the collet 40 is attached to the collet holder 41, or when the collet 40 is detached from the collet holder 41.

As shown in FIG. 4, the areas of the collet holder 41 corresponding to the fixing claws 51*t* and 56*k* are cut in a triangle shape so as not to interfere with the fixing claws 51*t* and 56*k*.

A method of attaching the collet 40 to the collet holder in the collet replacing unit 50 with such a configuration will be described using FIG. 3 to FIG. 7.

Figure 7:
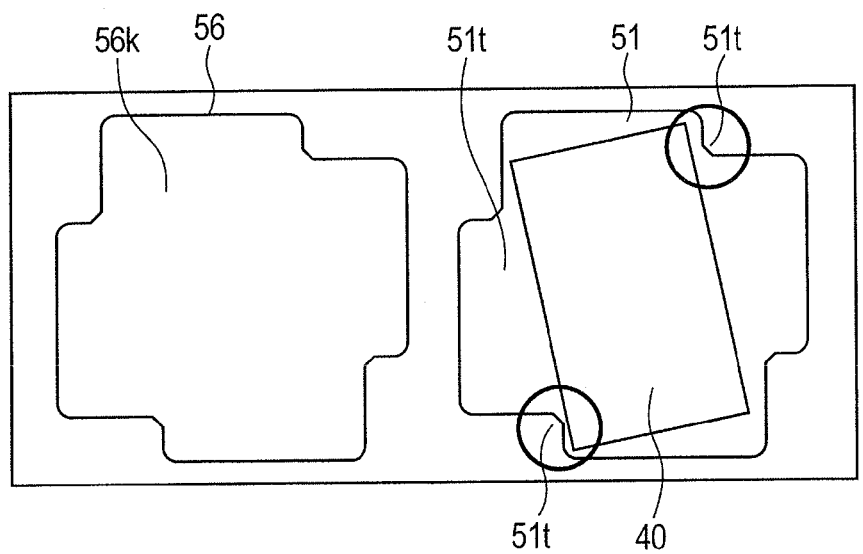
FIG. 7 is a diagram for showing a state in which the collet is rotated by the bonding head in the counterclockwise direction by $\theta$ from the state of FIG. 5 to be separated from fixing claws $51t$.

Each of FIG. 3 and FIG. 5 shows a state in which the collet 40 is simply housed in the supplying unit 51. In this case, the fixing claws 51*t* serve to prevent the collet 40 from protruding. Next, as shown in FIG. 4, the bonding head 35 is controlled to move the collet holder 41 to the upper side of the unused collet 40. After discarding, the bonding head 35 is only moved from the discarding unit 56 to the supplying unit 51 in the lateral direction. Thereafter, the collet holder 41 is allowed to descend to grasp the unused collet 40 while covering the whole, and the unused collet 40 is held by the magnet 41*j*. Since the four corners of the collet holder 41 are cut in a triangle shape, the collet can be held without interfering with the fixing claws 51*t*. Next, as shown in FIG. 7, the collet 40 is rotated by the bonding head 35 in the counterclockwise direction by θ from the state of FIG. 5 to be separated from the fixing claws 51*t*. Then, the bonding head 35 is lifted, and the attachment of the collet 40 is confirmed by the method shown in the first embodiment. Thereafter, the process is moved to the following operation.

Figure 8:
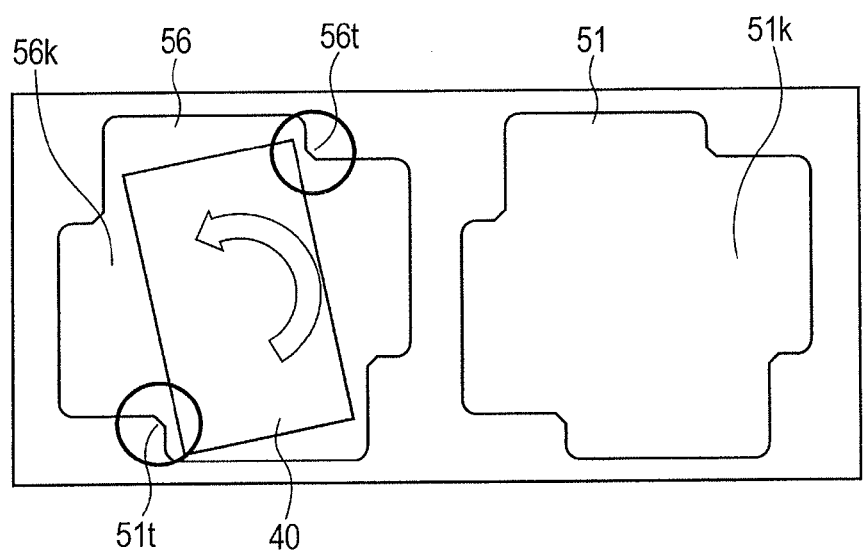
FIG. 8 is a diagram for showing a state in which the collet is allowed to descend and is rotated in the counterclockwise direction by $\theta$ on the upper side of a discarding unit to discard a used collet.
Figure 9:
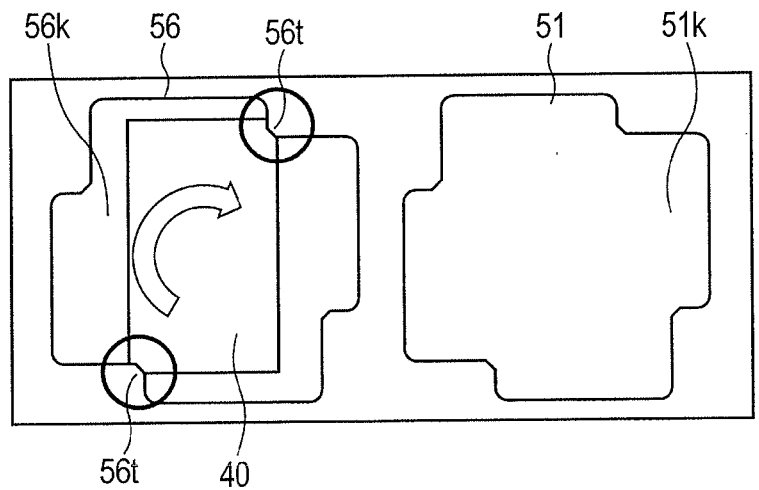
FIG. 9 is a diagram for showing a state in which the collet is allowed to descend with the bonding head to be inserted into an opening portion and is rotated in the clockwise direction by $\theta$ so as to interfere with the fixing claws.

Next, a method of discarding a used collet 40 to the discarding unit 56 will be described using FIG. 8 and FIG. 9. In the case of discarding, procedures opposite to the case of supplying an unused collet are performed. Specifically, the bonding head 35 is first controlled to move the collet 40 to the upper side of the opening portion 56*k* of the discarding unit 56. Thereafter, the collet 40 is rotated in the counterclockwise direction by θ so that the diagonal positions of the collet 40 do not interfere with the fixing claws 56*t*, and the state shown in FIG. 8 is realized. Next, the collet 40 is allowed to descend using the bonding head 35 to be inserted into the opening portion 56*k*, and the collet 40 is rotated in the counterclockwise direction by θ. Then, the diagonal positions of the collet 40 are moved to the lower side of the fixing claws 56*k*, and the state shown in FIG. 9 is realized. Thereafter, by pressing the diagonal positions of the collet 40 with the fixing claws 56*t*, the bonding head 35 is lifts the collet to overcome the holding force of the magnet 41*j* in order to detach the collet 40 from the collet holder 41. The collet 40 falls into the waste housing unit under the opening portion.

Then, the bonding head 35 is moved to the side of the supplying unit 51 to hold an unused collet 40, and the above-described procedures are performed.

In the above-described embodiment, the fixing claws are provided at the diagonal positions. Avoiding portions 41*c* cut in a triangle shape are provided at the diagonal positions of the collet holder 41 corresponding to the fixing claws in order to avoid the fixing claws. The positions of the fixing claws are not limited to the diagonal positions, but may be other positions. For example, the fixing claws are provided at the middle positions of the opposite two sides, and the shape of the avoiding portions 41*c* may be set in the middle portions of the collet holder 41 corresponding to the fixing claws so as not to interfere with the fixing claws by the rotation of the collet holder. To put it in an extreme way, a trapezoidal portion on the shorter side of the collet holder shown in FIG. 4 may be cut. In this case, it is necessary to position in the longitudinal direction. For example, convex portions are provided in the longitudinal direction of the collet holder for positioning, and concave portions may be provided at the corresponding positions of the collet. Even in the above-described embodiment, the avoiding portions 41*c* may not be in a triangle shape. For example, the avoiding portions 41*c* may be in a rectangular shape or ¼ circular shape.

In the above-described embodiment, the collet replacing unit 50 is provided at one position. However, the collet replacing unit 50 may be installed at any position in a movable range of the bonding head as long as a mounting process is not affected, and plural collet replacing units 50 may be installed. In this case, the collet replacing units 50 may be provided for different die sizes. Further, even if the die sizes are different, the outer shape of the collet may be standardized so as to be held by the common collet holder.

According to the above-described second embodiment, plural unused collets 40 are orderly stacked and housed, so that a stock area can be narrowed.

Further, according to the above-described second embodiment, the collet replacing unit 50 can be downsized by accessing the supplying unit 51 and the discarding unit 56 from the upper side, and a replacement area including the stock area can be narrowed.

Further, according to the above-described second embodiment, the collet 40 can be attached or detached to/from the collet holder 41 (bonding head 35) with a simple structure in which the fixing claws 51*t* and 56*t* are provided at the opening portions 51*k* and 56*k* of the supplying unit 51 and the discarding unit 56, respectively, and the magnet 41*j* is provided at the collet holder 41.

Third Embodiment

Figure 10:
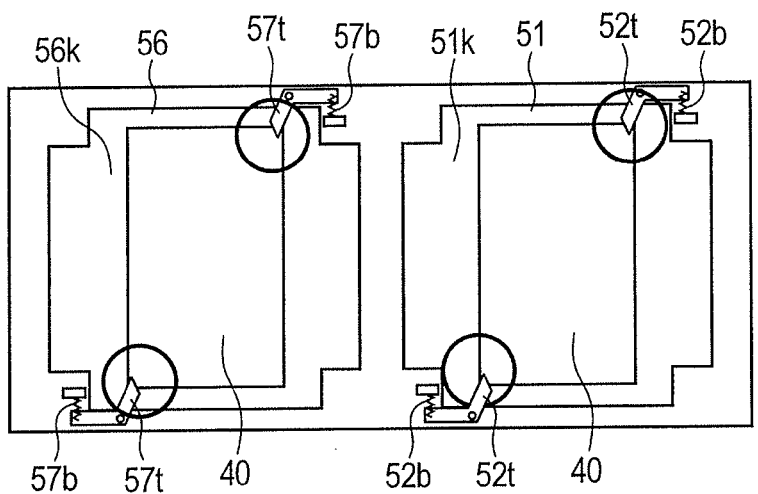
FIG. 10 is a diagram for showing a second embodiment of the collet replacing unit 50.

Next, a second example of the collet replacing unit 50 as a third embodiment of the collet replacing unit 50 will be described using FIG. 10. The third embodiment is different from the second embodiment in the following two points, and the other points are the same. First, the collet 40 is detached from the collet holder 41 by the rotation of the fixing claws 51*t* and 56*t* and the collet 40 in the second embodiment. In the third embodiment, movable claws 52*t* and 57*t* are provided at the positions where the fixing claws 51*t* and 56*t* exist. By moving the movable claws 52*t* and 57*t* with shape-memory alloy springs 52*b* and 57*b*, respectively, the collet 40 is attached or detached to/from the collet holder 41. The shape-memory alloy springs 52b and 57b release the holding of the collets 40 by shrinking the springs when current flows. Thus, it is not necessary to rotate the collet when the collet 40 is attached or discarded in the third embodiment.

Second, as similar to the first embodiment, when the collet 40 is pushed up by the compression spring 51b in the supplying unit 51 in the third embodiment, the movement of the movable claw 52t causes a collet for replacement to protrude. In order to prevent this, when the collet 40 is replaced in the third embodiment, the stretch of the compression spring 51b is fixed by a pulse motor (not shown), and the fixing by the pulse motor is released when the movable claw 52t holds the collet. Specifically, the pulse motor that fixes the stretch of the compression spring 51b configures protrusion prevention means.

In this case, using a pulse motor or a servo motor as moving means of the stacked unused collets, the collet is moved by the pulse motor or the servo motor by the height of the collet to serve as protrusion means, so that the movable claws 52t can be eliminated. This point can be applied to the second embodiment, and the fixing claws 51t can be eliminated.

It should be noted that there are various driving methods of the movable claws 52t and 57t. For example, the movable claws 52t and 57t may be driven by a cylinder or a motor.

Fourth Embodiment

Figure 11:
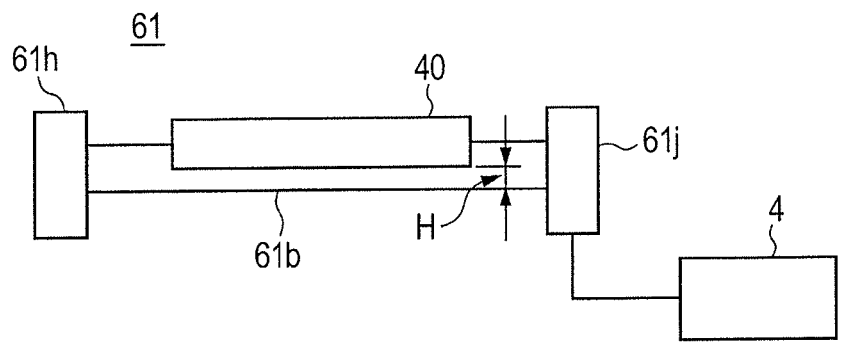
FIG. 11 is a diagram for showing a configuration of a collet descent distance correcting unit.

Next, an embodiment of the collet descent distance correcting unit 60 and a collet descent distance correcting method will be described using FIG. 11. The collet descent distance correcting unit 60 includes a collet height measuring unit 61 that measures changes of the height of the collet, and a control device 4 that corrects the descent distance of the collet, namely, the bonding head 35 on the basis of the measurement result by the collet height measuring unit. The collet height measuring unit 61 is a commercial sensor configured using a light emitting unit 61h and a light receiving sensor 61j. The collet height measuring unit 61 is fixed to the die bonder structure unit while being adjacent to the collet replacing unit 50 or the collet replacing unit 50. The light emitting unit 61h emits light 61b with a certain bandwidth to the light receiving sensor 61j, and the light receiving sensor 61j can measure the length H of a light receiving unit or the length of a light-blocking unit in a unit of nm.

A collet descent distance correcting method by such a collet descent distance correcting unit 60 will be described. The collet 40 is allowed to descend to a certain position of the collet descent distance correcting unit 60. When the length of the light receiving unit of the collet 40 before collet replacement is Hb and the length of the light receiving unit of the collet 40 after collet replacement is Ha, the height change ΔH of the collet 40 is represented as the following formula (1).

$$\Delta H = Hb - Ha \quad (1)$$

The descent distance BH of the bonding head 35 when the die D is picked up or is attached to the substrate is corrected only by the height change ΔH of the collet 40. The correction may be done by using previous descent distance BHb or a standard descent distance BH.

According to the above-described fourth embodiment, variations in the height of the collet at the time of manufacturing can be corrected in a unit of nm, and the die can be picked up and mounted to the substrate or the like without an adverse effect on the die such as destruction in the worst case.

Fifth Embodiment

Figure 12:
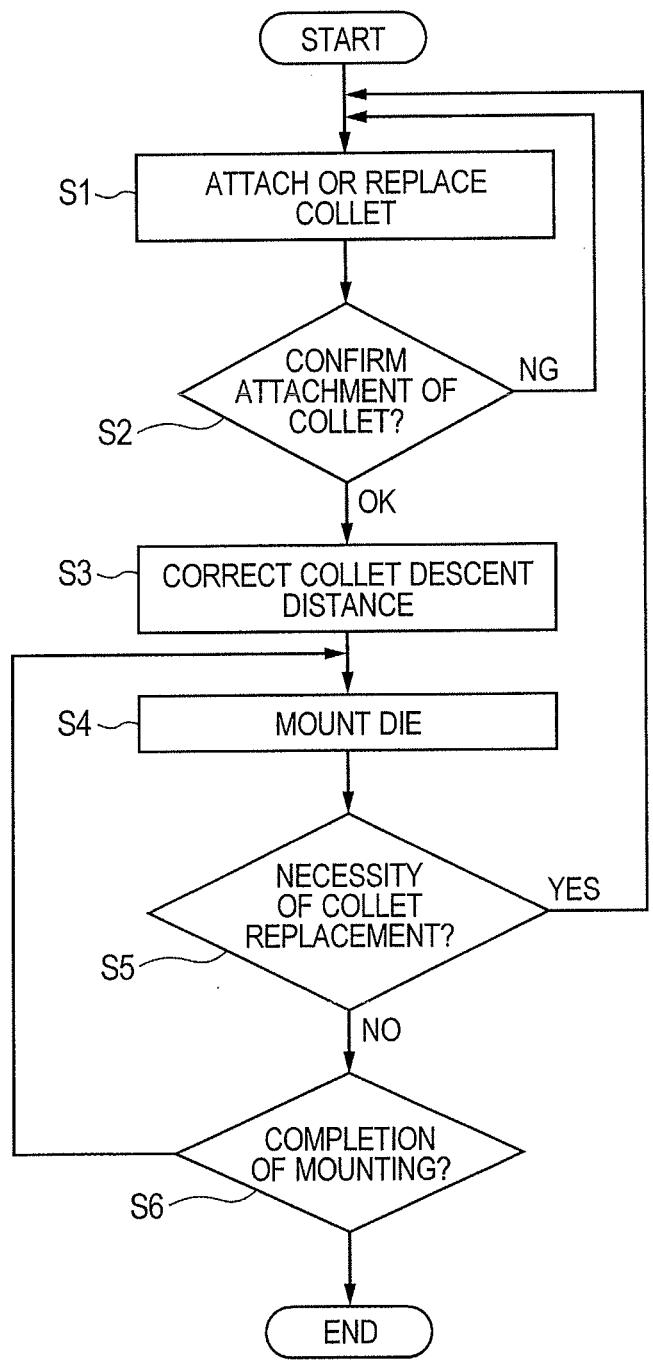
FIG. 12 is a diagram for showing a bonding flow according to an embodiment.

Next, a bonding flow in the embodiment will be described using FIG. 12.

In the first place, a collet 40 is attached to the bonding head on the basis of the collet attachment method shown in the second or third embodiment (S1). The attachment of the collet 40 is confirmed on the basis of the first embodiment (S2). If the attachment of the collet cannot be confirmed, S1 is performed again. Next, the descent distance of the collet is corrected on the basis of the fourth embodiment (S3). Thereafter, the die D is mounted (S4). During the mounting, time of replacing the collet 40 is determined (S5). If replacement is necessary, the flow is moved to S1 to replace the collet 40, and the processes after S2 are continued. Finally, it is determined whether or not a predetermined mounting process is completed, and the process is completed (S6).

As a method of confirming the attachment in the flow, optical means provided at the die bonder to confirm the posture of the die may be used without using the method of the first embodiment.

According to the above-described fifth embodiment, a bonding method with a high operation ratio can be realized.

According to the above-described first to fourth embodiments, a die bonder and a bonding method with a high operation ratio can be provided.

The embodiments of the present invention have been described above, and various alternative, modified, or converted examples are available for those skilled in the art on the basis of the above description. The present invention includes various alternative, modified, or converted examples without departing from the gist of the present invention.

What is claimed is:

1. A die bonder comprising:
   a collet holder that holds a collet by a magnet;
   a bonding head that includes the collet holder at its tip end and absorbs a die with the collet to bond the die on a substrate;
   a collet replacing unit having a discarding unit that includes a first opening portion having plural first engagement portions engaged with the collet on the upper side and discards a used collet, a supplying unit that includes a second opening portion having plural second engagement portions engaged with the collet on the upper side, stacking plural unused collets, a moving means that moves the unused collets to the second opening portion by a compression spring, and a protrusion prevention means to prevent the unused collets from protruding from the second opening portion by the plural second engagement portions; and
   a control device that inserts the collet holder from the first opening portion, controls engagement of the engagement portions with the collet holder to discard used collets to the discarding unit, inserts the collet holder from the second opening portion, and ejects an upper collet of the plural stacked unused collets to be attached to the collet holder, wherein
   the collet holder comprises attachment confirmation means that confirms attachment of at least one of the unused collets,
   the attachment confirmation means confirms the attachment, based on either changes in a volume of flow flowing to an absorption hole of the bonding head including the collet holder or differential pressure, and
   the attachment confirmation means includes an orifice provided at the absorption hole of the bonding head including the collet holder, and a confirmation bar that moves the orifice when the collet holder holds the collet.

2. The die bonder according to claim 1, wherein the protrusion prevention means is formed by each of the second engagement portions, and the control device controls engagement of the second engagement portions with the collet holder to attach the unused collets to the collet holder.

3. The die bonder according to claim 2, wherein the first engagement portions and the second engagement portions are fixing claws that are provided at the first opening portion and the second opening portion, respectively, so as to be engaged with the used collets and the unused collets, and the control device controls engagement with the fixing claws while rotating the used collets and the unused collets in parallel with the first opening portion and the second opening portion, respectively.

4. The die bonder according to claim 2, wherein the first engagement portions and the second engagement portions are movable claws that are provided at the first opening portion and the second opening portion, respectively, so as to be engaged with the used collets and the unused collets, and the control device controls the engagement while controlling the movable claws for the first opening portion and the second opening portion.

5. The die bonder according to claim 1, wherein the first engagement portions and the second engagement portions are provided to be engaged with diagonal portions of the used collets and the unused collets, respectively.

6. The die bonder according to claim 1, wherein four corners of the collet holder are cut so that the first engagement portions and the second engagement portions can be engaged with the used collets and the unused collets, respectively.

7. The die bonder according to claim 1, wherein the moving means is a pressing means that presses the unused collets to the second opening portion.

8. A die bonder comprising:
a collet holder that holds a collet by a magnet,
a bonding head that includes the collet holder at its tip end and absorbs a die with the collet to bond the die on a substrate;
a collet replacing unit having a discarding unit that includes a first opening portion having plural first engagement portions engaged with the collet on the upper side and discards a used collet, a supplying unit that includes a second opening portion having plural second engagement portions engaged with the collet on the upper side, stacking plural unused collets, a moving means that moves the unused collets to the second opening portion by a compression spring, and a protrusion prevention means to prevent the unused collets from protruding from the second opening portion by the plural second engagement portions; and
a control device that inserts the collet holder from the first opening portion, controls engagement of the engagement portions with the collet holder to discard the used collets to the discarding unit, inserts the collet holder from the second opening portion, and ejects an upper collet of the plural stacked unused collets to be attached to the collet holder,
a collet height measuring unit that measures a height of the collet held by the collet holder when the collet is unused, wherein
the collet holder comprises attachment confirmation means that confirms the attachment of the unused collets, and
the control device corrects the descent distance of the unused collet based on a measurement result by the collet height measuring unit.

9. The die bonder according to claim 8, wherein the collet height measuring unit includes a light emitting unit that outputs band light in a height direction of the unused collet, and a light receiving sensor that measures the length of a light receiving unit or a light blocking unit of the unused collet.

* * * * *